US008222676B2

(12) United States Patent
Kato

(10) Patent No.: US 8,222,676 B2
(45) Date of Patent: Jul. 17, 2012

(54) TRANSISTOR

(75) Inventor: Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 284 days.

(21) Appl. No.: 11/783,092

(22) Filed: Apr. 5, 2007

(65) Prior Publication Data

US 2007/0181911 A1 Aug. 9, 2007

Related U.S. Application Data

(62) Division of application No. 10/967,129, filed on Oct. 19, 2004, now Pat. No. 7,211,840.

(30) Foreign Application Priority Data

Oct. 31, 2003 (JP) ................................. 2003-373510

(51) Int. Cl.
*H01L 23/48* (2006.01)

(52) U.S. Cl. ................. 257/206; 257/401; 257/E29.135; 257/E29.136; 257/E23.151; 326/102; 326/103

(58) Field of Classification Search .................... 257/206
See application file for complete search history.

(56) References Cited

U.S. PATENT DOCUMENTS

| | | | |
|---|---|---|---|
| 5,731,613 A | 3/1998 | Yamazaki et al. | |
| 5,760,454 A * | 6/1998 | Nishi | 257/401 |
| 5,955,763 A * | 9/1999 | Lin | 257/355 |
| 6,028,580 A | 2/2000 | Kosegawa et al. | |
| 6,137,713 A * | 10/2000 | Kuroda et al. | 365/149 |
| 6,388,292 B1 * | 5/2002 | Lin | 257/356 |
| 6,462,723 B1 | 10/2002 | Yamazaki et al. | |
| 6,765,268 B2 * | 7/2004 | Akamine et al. | 257/368 |
| 7,006,177 B2 | 2/2006 | Hirakata et al. | |
| 2004/0164407 A1 * | 8/2004 | Nakajima et al. | 257/724 |

FOREIGN PATENT DOCUMENTS

| | | |
|---|---|---|
| JP | 62-242365 | 10/1987 |
| JP | 03-203270 | 9/1991 |
| JP | 06-326214 | 11/1994 |
| JP | 10-335614 | 12/1998 |
| JP | 11-074505 | 3/1999 |

\* cited by examiner

*Primary Examiner* — Matthew W Such
*Assistant Examiner* — Abul Kalam
(74) *Attorney, Agent, or Firm* — Nixon Peabody LLP; Jeffrey L. Costellia

(57) ABSTRACT

A transistor and a semiconductor integrated circuit with a reduced layout area. Area reduction of a transistor is realized by arranging contacts at higher density. Specifically, in a transistor including a pair of impurity regions and a gate electrode 604 sandwiched therebetween, one of the impurity regions has respective contact holes (a first contact hole 601 and a second contact hole 602) and the other impurity region has a contact hole (a third contact hole 603), and contacts of the contact holes 601 to 603 or regions 605 to 607 each including a margin for a contact are arranged so as to be a triangular lattice except for the gate electrode 604.

10 Claims, 8 Drawing Sheets

Prior Art

Prior Art

Prior Art

TRANSISTOR

This application is Divisional of U.S. application Ser. No. 10/967,129 filed Oct. 19, 2004 now U.S. Pat. No. 7,211,840.

BACKGROUND OF THE INVENTION

1. Field of the Invention

The present invention relates to a transistor whose area is to be reduced.

2. Description of the Related Art

In recent years, downsizing of a gate electrode has been advanced by a technique of slimming, in which a line width is narrowed after the pattern formation using an exposure unit, and the like. Meanwhile, a contact diameter and a distance between a contact hole and a gate electrode are difficult to be reduced to the precision higher than the exposure precision, and in an LSI (Large Scale Integration) on a single-crystalline silicon substrate, downsizing is achieved by a technique of a self-alignment contact and the like. However, when a self-alignment contact technology cannot be employed because of a reason of a process, a design rule that a contact diameter is much larger than a gate length is required to be adopted. The design rule in such a case is, for example, that a contact diameter is approximately 0.2 μm whereas a gate length is 0.065 μm.

On the other hand, a technology for forming an LSI on a glass substrate has been developed recently. The minimum size for processing by a process technology on a glass substrate is much larger than the one by a process technology on a single-crystalline silicon substrate since the glass substrate is larger in area than the single-crystalline silicon substrate and shrink due to heat occurs. In particular, when an organic interlayer film is employed in the case of planarization being required for a display, downsizing of a contact thereof is difficult, and a contact diameter and a distance between a contact hole and a gate electrode are much larger in design rule than a gate length. For example, a design rule that a gate length is 1 μm, a contact diameter is 3 μm, and a distance between a contact hole and a gate electrode is 3 μm is adopted.

In the case of the layout of a transistor according to the above-mentioned design rule, a proportion occupied by a region relating to a contact is increased and downsizing of a design rule of a gate length and the like gives makes few contributions to the reduction in layout area. In such a case, it is most effective for the reduction in layout area to reduce the area of the region relating to the contact.

SUMMARY OF THE INVENTION

The invention is made in view of the foregoing problems. It is a feature of the invention to provide a transistor with reduced area and a semiconductor chip with reduced area, by effectively reducing a layout area of the transistor particularly when a design rule relating to a contact is larger compared to a design rule of a gate length.

An idea of the invention is to optimize the arrangement of contacts as a means for reducing a layout area. The invention is particularly effective in the case of a design rule that either of a contact diameter and a distance between a contact hole and a gate electrode is larger than a gate length.

In a transistor, normally, a contact hole is disposed at each side of a gate electrode symmetrically. A contact hole with the same size is employed in order to reduce variations in etching rate when forming a hole, and takes circle shape after the formation. Accordingly, in a conventional transistor, a circular contact hole is disposed at each side of a gate electrode symmetrically.

Typical arrangements of circles so as to arrange at high density on a flat surface are a tetragonal lattice and a triangular lattice. The arrangement at the highest density is the triangular lattice. As for the area including a certain number of circles, the triangular lattice is approximately $\sqrt{3}/2$ time as large as the tetragonal lattice, that is, smaller than the tetragonal lattice by approximately 15%. Contact holes in the conventional transistor are arranged so as to be similar to a tetragonal lattice, which is not and the arrangement at the highest density. Accordingly, by arranging contact holes to be a triangular lattice, the area of a transistor can be reduced.

A feature of the invention is a layout of a transistor, in which contacts are arranged at the highest density on the assumption that a contact hole, more accurately a region including a margin for a contact is a circle with the same size. There is a gate electrode in practice and the contact hole are not arranged to be a triangular lattice, though features thereof are described hereinafter with reference to FIG. 6.

A transistor generally includes a gate electrode 604 and a pair of impurity regions at each side thereof, wherein each impurity region is electrically connected to a wiring via a contact hole. In a transistor according to the invention, at least one of the impurity regions has two contact holes (a first contact hole 601 and a second contact hole 602), while the other impurity region has one contact hole (a third contact hole 603). In the transistor according to the invention, the contact holes 601 to 603, or regions 605 to 607 each including a margin for a contact are arranged to be a triangular lattice except for the gate electrode 604. Accordingly, for example, a distance d(13) between the first and the third contact holes is equal to a distance d(23) between the second and the third contact holes. Needless to say, they are not required to be equal exactly, and it is important that the area becomes smaller than in the case of the conventional arrangement of a tetragonal lattice by adopting this arrangement.

In other words, a length dp obtained by projecting the distance d(13) between the first and the third contact holes on a perpendicular direction to a line segment connecting the first contact hole 601 and the second contact hole 602 is shorter than a distance between contact holes sandwiching a gate electrode therebetween, namely the shortest distance L+2d between two contact holes sandwiching a gate electrode, arranged in a conventional tetragonal lattice.

A distance d denotes a design rule of a distance between a gate electrode and a contact hole. Each of the regions 605 to 607 including a margin for a contact can be assumed to be a circular region having a diameter of r+2d when a diameter of a contact hole is denoted by r.

In addition, centers of the first contact hole 601, the second contact hole 602 and the third contact hole 603 are denoted by A, B and C, respectively, and a middle point of a line segment connecting the point A and the point B is denoted by D. AC>CD can be satisfied here.

In this arrangement, the gate electrode 604 cannot be formed straight and the gate electrode 604 is formed so as to wriggle between the first and the third contact holes, and between the second and the third contact holes. The gate electrode 604 contributes to an effective area when being formed so as to cross perpendicularly to a line segment AC connecting the center A of the first contact hole 601 and the center C of the third contact hole 603 at a middle point thereof, and in addition, cross perpendicularly to a line segment BC connecting the center B of the second contact hole 602 and the center C of the third contact hole 603 at a middle point thereof.

According to the layout described above, a transistor which is smaller in area can be realized, particularly when a contact diameter or a distance between a contact hole and a gate electrode is larger than a gate length.

According to the invention, the optimum arrangement of contacts realizes a transistor which is smaller in area, leading to the realization of a semiconductor integrated circuit with a reduced chip area.

According to the invention, a reduction ratio of a transistor area is high when a contact diameter or a distance between a contact hole and a gate electrode is larger than a gate length. Therefore, the invention is effective particularly in such a case.

DETAILED DESCRIPTION OF THE INVENTION

Although the invention is fully described by way of an Embodiment Mode and Embodiments with reference to the accompanying drawings, it is to be understood that various changes and modifications will be apparent to those skilled in the art. Therefore, unless such changes and modifications depart from the scope of the invention hereinafter, defined, they should be constructed as being included therein.

Figure 1:
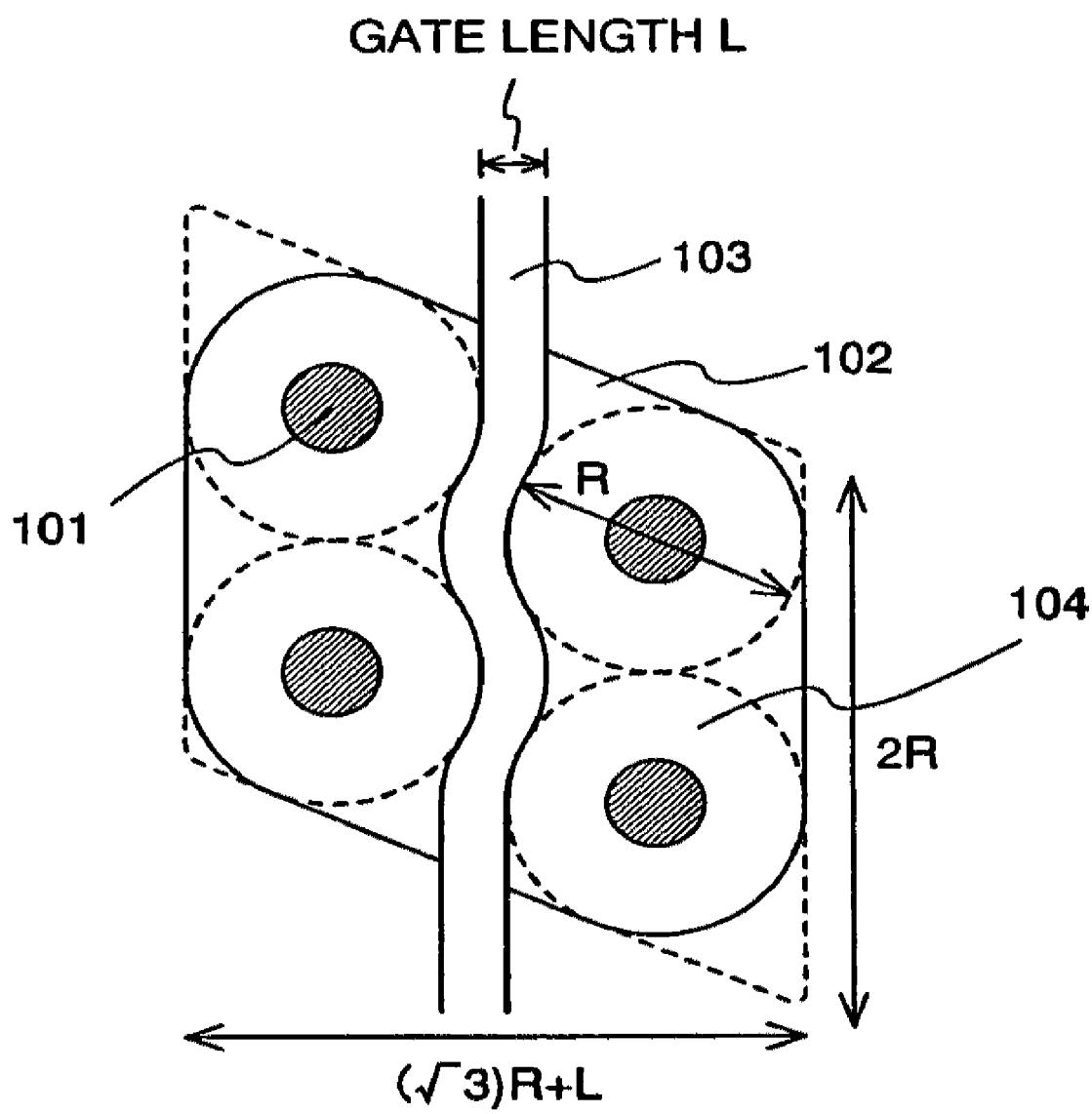
FIG. 1 is a top plan view of a transistor according to the invention.
Figure 2:
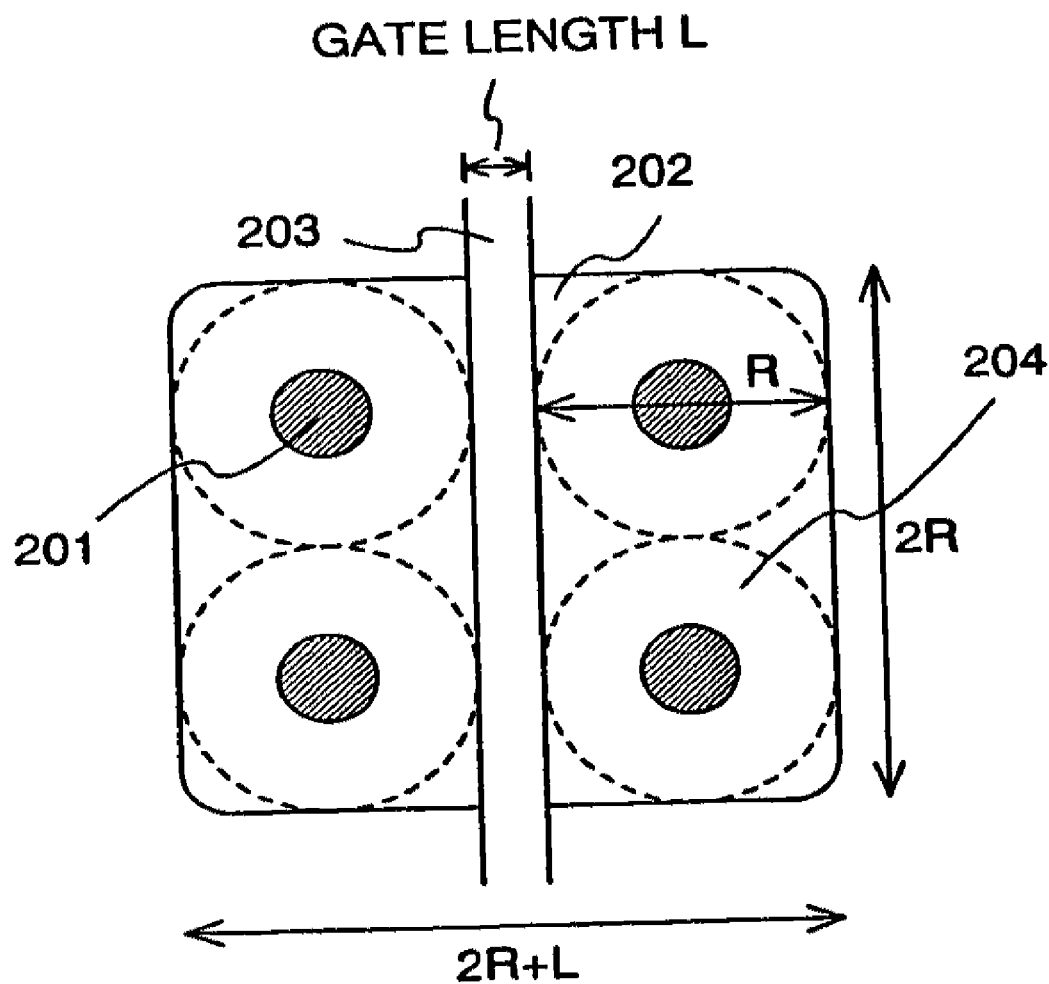
FIG. 2 is a top plan view of a conventional transistor.

A layout of a transistor according to the invention is illustrated in comparison with a layout of a conventional transistor. FIG. 1 and FIG. 2 show a typical layout of a transistor according to the invention and a typical layout of a conventional transistor, respectively.

In a transistor shown in FIG. 2, four contacts 201 and a gate electrode 203 are arranged on an active region 202. A region 204 including a margin for a contact is assumed to be a circle having a diameter of R, which is denoted by a dotted line. In the layout of a conventional transistor, as shown in FIG. 2, the regions 204 each including a margin for a contact are arranged to be a tetragonal lattice when the size of a gate electrode is not considered. In that case, the area of the active region 202 is approximately 2R×(2R+L).

In a transistor shown in FIG. 1 that is a typical example according to the invention, four contacts 101 and a gate electrode 103 are arranged on an active region 102. A region 104 including a margin for a contact is assumed to be a circle having a diameter of R, which is denoted by a dotted line. In the layout of a transistor according to the invention, as shown in FIG. 1, the regions 104 each including a margin for a contact are arranged to be a triangular lattice when the size of a gate electrode is not considered. In that case, the area of the active region 102 is approximately 2R×((√3)R+L).

Compared with areas of both the transistors each other, the area of the transistor according to the invention is smaller regardless of a gate length. The shorter a gate length L is, the higher a reduction ratio of the area is. Therefore, the invention is effective particularly when a design rule of a vicinity of a contact is larger than the gate length L.

Note that, a region including a margin for a contact mainly depends on a contact hole (a diameter r) and a distance d between a contact hole and a gate electrode, which can be assumed to be a circle having a diameter R of approximately r+2d.

Embodiments of the invention are described below.

Embodiment 1

The invention is also effective for a transistor with a double-gate structure.

Figure 7:
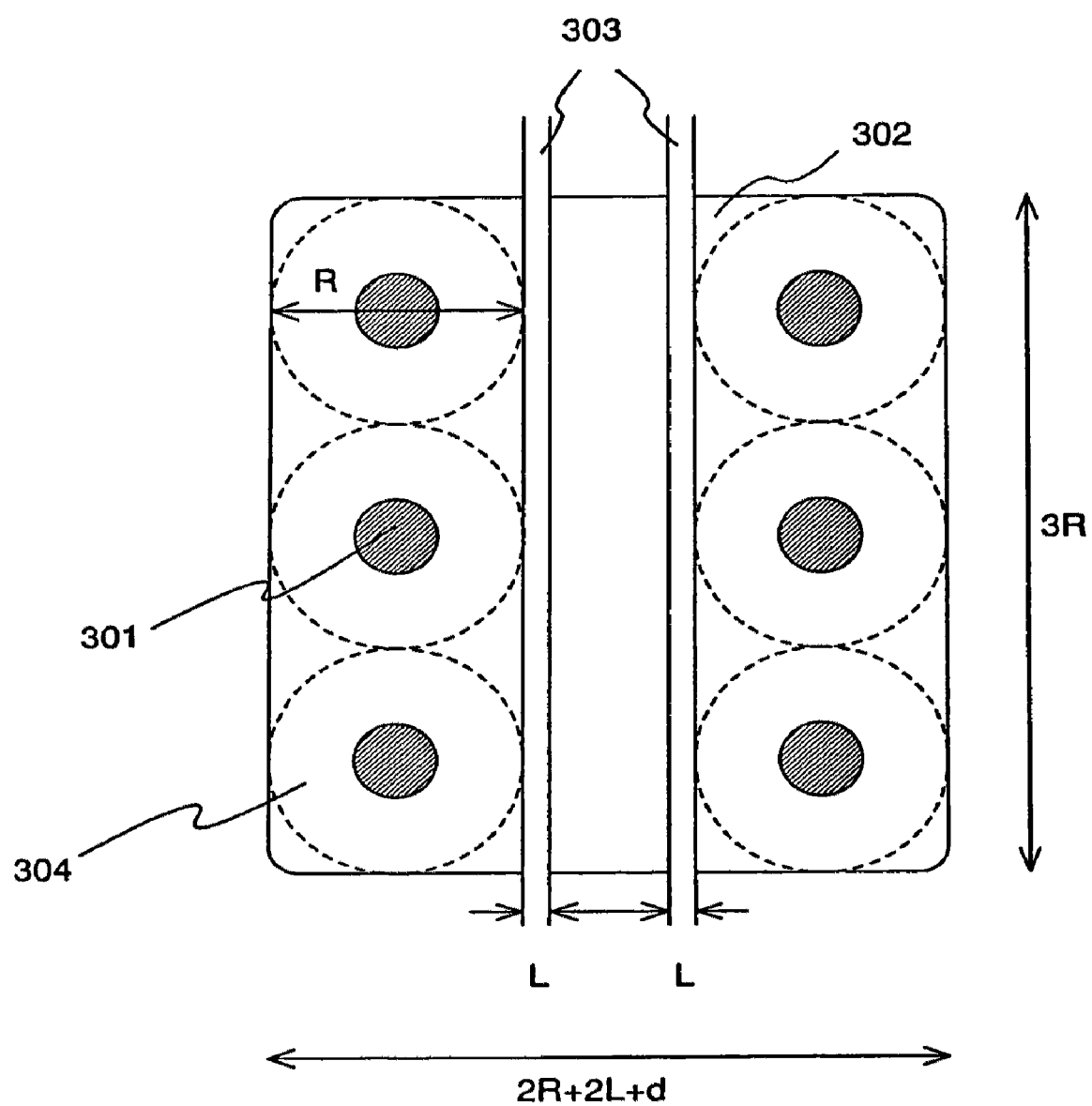
FIG. 7 is a top plan view of a conventional transistor with a double-gate structure.

In a transistor shown in FIG. 7 that is a conventional transistor with a double-gate structure, six contacts 301 and two gate electrodes 303 are arranged on an active region 302. A region 304 including a margin for a contact is assumed to be a circle having a diameter of R, which is denoted by a dotted line. In the transistor shown in FIG. 7, the regions 304 each including a margin for a contact are arranged to be a tetragonal lattice when a gate length L and a distance d between the gate electrodes are not considered. In that case, the area of the active region 302 is approximately 3R×(2R+2L+d).

Figure 3:
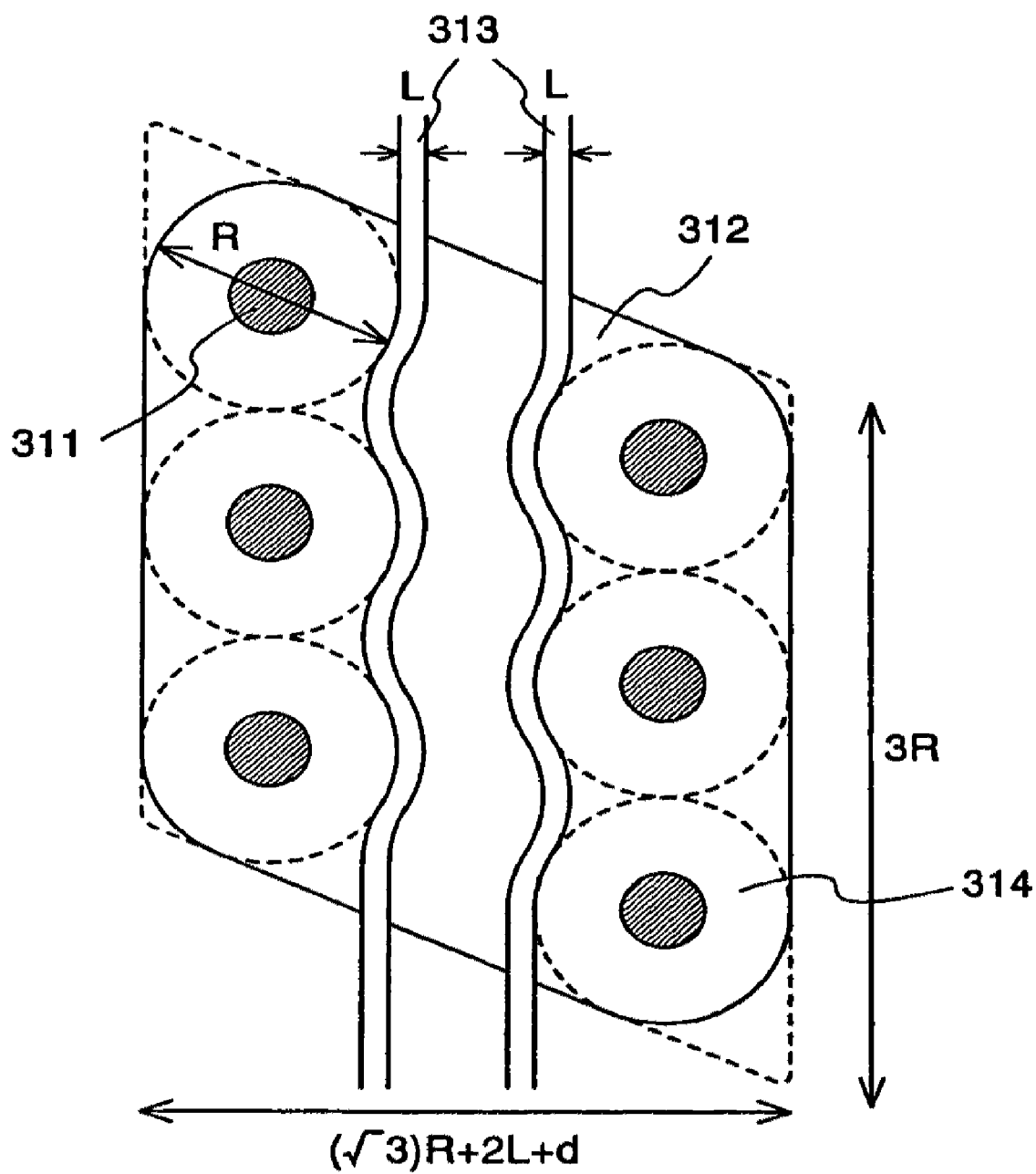
FIG. 3 is a top plan view of a transistor with a double-gate structure according to the invention.

In a transistor shown in FIG. 3 that is a transistor with a double-gate structure according to the invention, six contacts 311 and two gate electrodes 313 are arranged on an active region 312. A region 314 including a margin for a contact is assumed to be a circle having a diameter of R, which is denoted by a dotted line. In the transistor shown in FIG. 3, the regions 314 each including a margin for a contact are arranged to be a triangular lattice when a gate length L and a distance d between gate electrodes are not considered. In that case, the area of the active region 312 is approximately 3R×((√3) R+2L+d).

Compared with the areas of both the transistors each other, the area of the transistor according to the invention is smaller regardless of the gate length L and the distance d between gate electrodes. The shorter the gate length L and the distance d between gate electrodes are, the higher a reduction ratio of the area is. Therefore, the invention is effective particularly when a design rule of a vicinity of a contact is larger than the gate length L and the distance d between gate electrodes.

Note that, the invention can also be applied to a transistor with a triple-gate structure, and a transistor with a multi-gate structure with four or more gate lines, in addition to a transistor with a double-gate transistor.

Embodiment 2

Described below is an example in which the area of a logic gate is practically reduced by applying a transistor according to the invention.

Figure 4A:
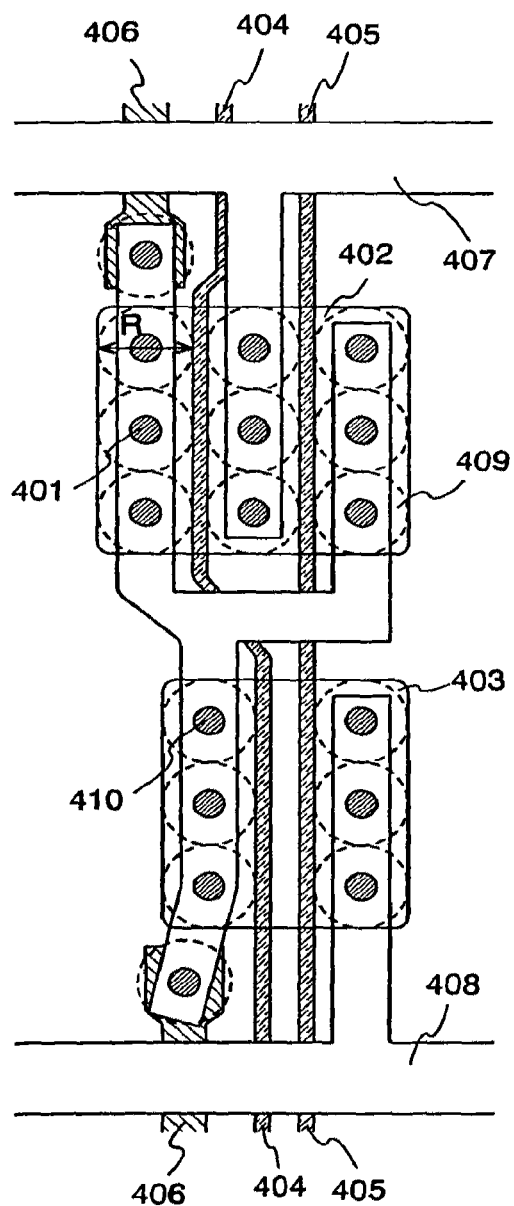
FIGS. 4A and 4B are top plan views of a conventional two-input NAND gate.

FIG. 4A shows an example of a layout of a conventional two-input NAND gate, comprising two P-channel TFTs and two N-channel TFTs. The two P-channel TFTs include an active region 402, a contact 401, and a gate electrode connected to input signal lines 404 and 405, while the two N-channel TFTs include an active region 403, a contact 410, and a gate electrode connected to the input signal lines 404 and 405.

In each of the two P-channel TFTs, one of a pair of impurity regions is connected to a power supply line 407. The two N-channel TFTs are connected in series to each other and one of impurity regions at both ends is connected to a ground line 408. The other impurity region of each P-channel TFT and the other of the impurity regions of the N-channel TFTs connected in series are connected to an output signal line 406. A region 409 including a margin for a contact is assumed to be a circle having a diameter of R, which is denoted by a dotted line.

Figure 4B:
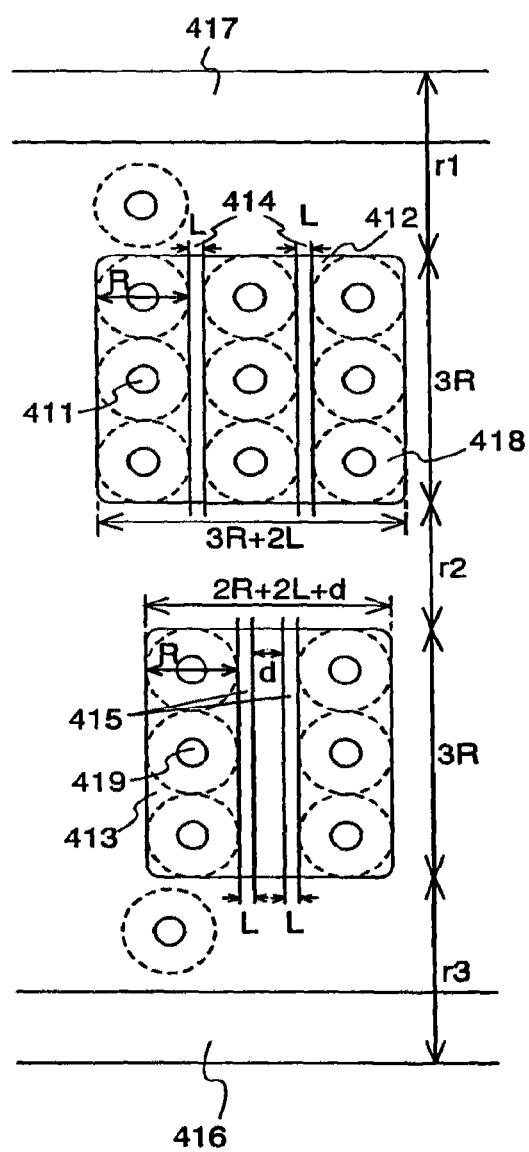

FIG. 4B shows a layout in which part of the wirings in FIG. 4A is omitted, which comprises a power supply line 417, a ground line 416, the two P-channel TFTs including an active region 412, a gate electrode 414 and a contact 411, and the two N-channel TFTs including an active region 413, a gate electrode 415 and a contact 419. A region 418 including a margin for a contact is assumed to be a circle having a diameter of R, which is denoted by a dotted line.

This figure indicates as follows. The area of the active region 412 forming the two P-channel TFTs is approximately $3R \times (3R+2L)$ when a gate length is denoted by L, while the area of the active region 413 forming the two N-channel TFTs is approximately $3R \times (2R+2L+d)$ when a gate length and a distance between gate electrodes are denoted by L and d, respectively.

Accordingly, the width (a direction of a channel length) of the logic gate is approximately $3R+2L$. The height (a direction of a channel width) of the logic gate is approximately $6R+r1+r2+r3$ when a distance of the power supply line 417 to the ground line 416 except the active regions 412 and 413 is divided into r1 that is on the power supply line 417 side, r2 that is a distance between the active regions 412 and 413, and r3 that is on the ground line 416 side.

Figure 5A:
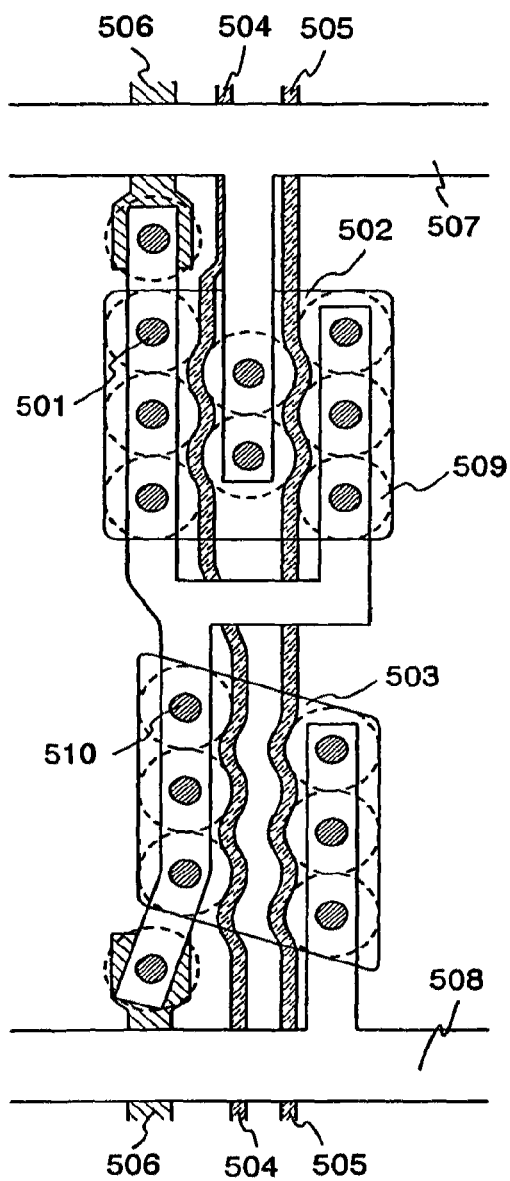
FIGS. 5A and 5B are top plan views of a two-input NAND gate according to the invention.

FIG. 5A shows an example of a layout of a two-input NAND gate according to the invention, comprising two P-channel TFTs and two N-channel TFTs. The two P-channel TFTs include an active region 502, a contact 501, and a gate electrode connected to input signal lines 504 and 505, while the two N-channel TFT's include an active region 503, a contact 510, and a gate electrode connected to the input signal lines 504 and 505.

In each of the two P-channel TFTs, one of a pair of impurity regions is connected to a power supply line 507. The two N-channel TFTs are connected in series to each other and one of impurity regions at both ends is connected to a ground line 508. The other impurity region of each P-channel TFT and the other of the impurity regions of the N-channel TFTs connected in series are connected to an output signal line 506. A region 509 including a margin for a contact is assumed to be a circle having a diameter of R, which is denoted by a dotted line.

Figure 5B:
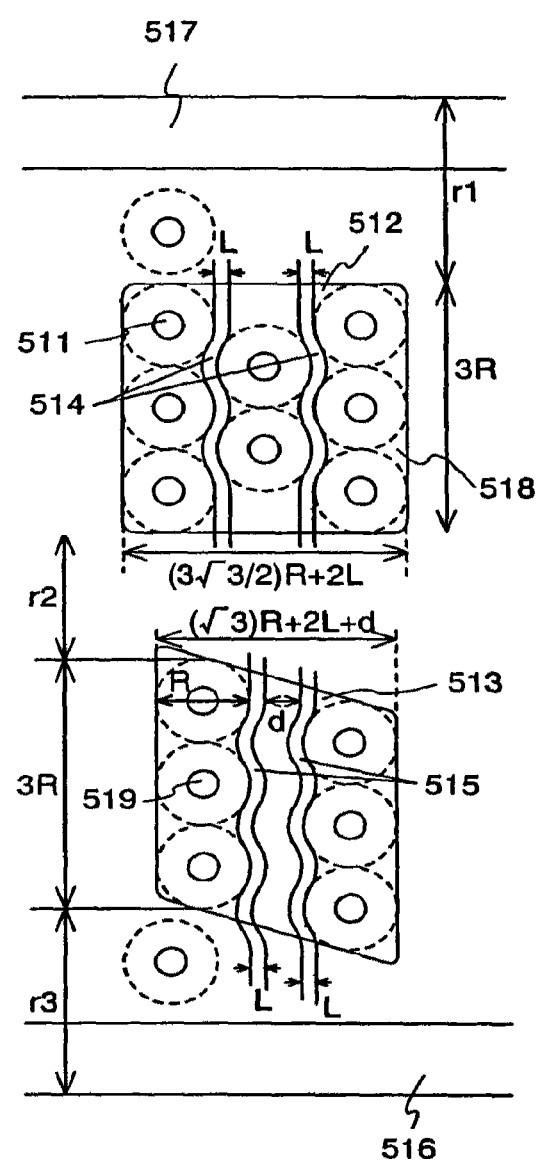
Figure 6:
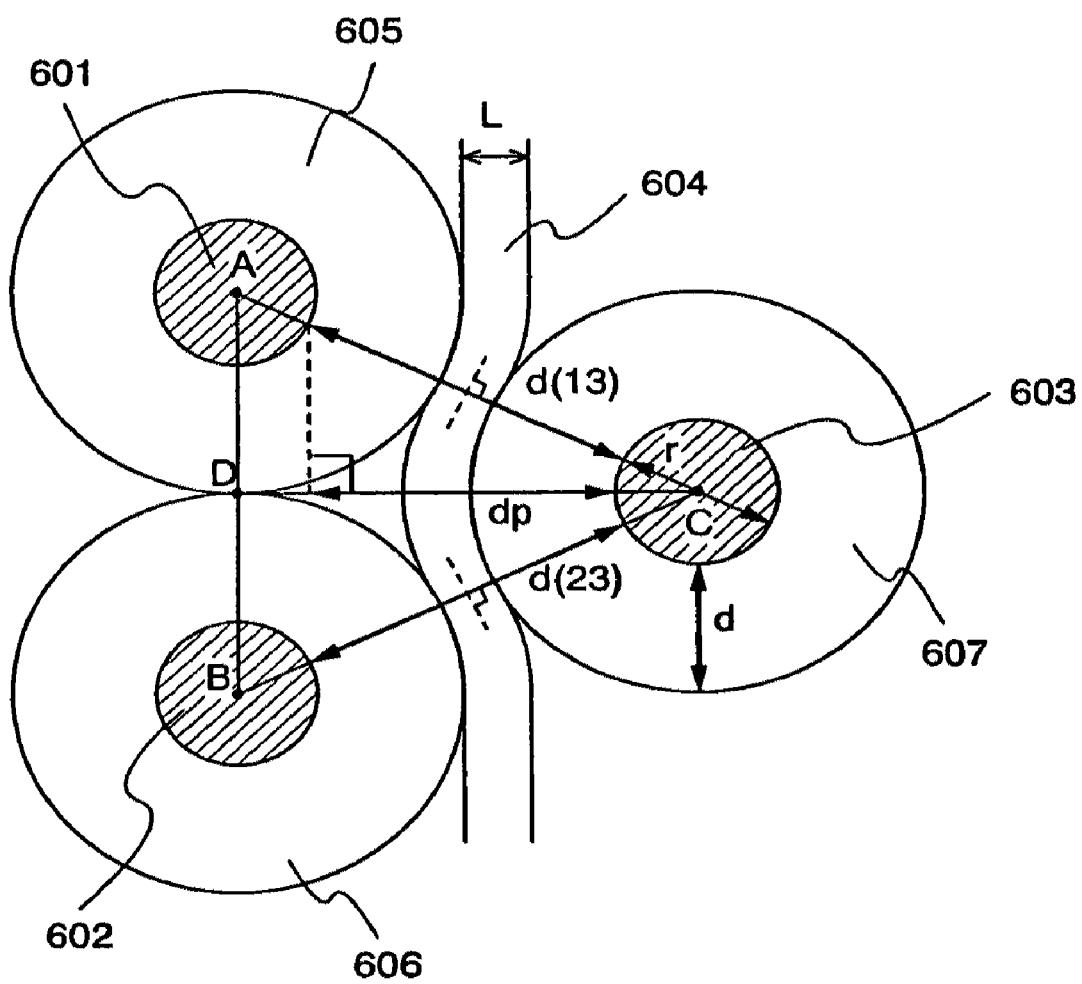
FIG. 6 is a top plan view of part of a transistor according to the invention.

FIG. 5B shows a layout in which part of the wirings in FIG. 5A is omitted, which comprises a power supply line 517, a ground line 516, the two P-channel TFTs including an active region 512, a gate electrode 514 and a contact 511, and the two N-channel TFTs including an active region 513, a gate electrode 515 and a contact 519. A region 518 including a margin for a contact is assumed to be a circle having a diameter of R, which is denoted by a dotted line.

This figure indicates as follows. The area of the active region 512 forming the two P-channel TFTs is approximately $3R \times (3(\sqrt{3}) R/2+2L)$ when a gate length is denoted by L, while the area of the active region 513 forming the two N-channel TFTs is approximately $3R \times ((\sqrt{3}) R+2L+d)$ when a gate length and a distance between gate electrodes are denoted by L and d, respectively.

Accordingly, the width (a direction of a channel length) of the logic gate is approximately $3 (\sqrt{3}) R/2+2L$. The height (a direction of a channel width) of the logic gate is approximately $6R+r1+r2+r3$ when a distance of the power supply line 517 to the ground line 516 except the active regions 512 and 513 is divided into r1 that is on the power supply line 517 side, r2 that is a distance between the active regions 512 and 513, and r3 that is on the ground line 516 side.

When comparing layout areas of the logic gates in this embodiment, a conventional layout area (FIG. 4) is approximately $(3R+2L) \times (6R+r1+r2+r3)$, while a layout area according to the invention (FIG. 5) is approximately $(3(\sqrt{3}) R/2+2L) \times (6R+r1+r2+r3)$. It indicates that the invention can realize a layout having a small area.

Note that in a layout of a transistor according to the invention, the area of an active region is reduced, while the length in the direction of the gate width may be larger than that in a conventional layout since contacts sandwiching a gate electrode are arranged to deviate in the direction of the gate width. However, as described in this embodiment, such a case does not become a serious problem.

For example, in the active region 512 of the P-channel TFTs, the number of contacts connected to the power supply line 517 is reduced by one, so that the length in the direction of the gate width can be equal to the conventional one. Since this layout is effective particularly when a contact is large in size, contact resistance seldom affects the circuit property. The active region 513 of the N-channel TFTs is longer in the direction of the gate width than the conventional one, however, which does not affect the height (a direction of a channel width) of the logic gate because a region which is not used in a conventional layout is used.

Note that by employing a transistor according to the invention, the area of any kind of circuit configured by TFTs can be reduced as well as the area of the two-input NAND gate described in this embodiment. Therefore, as for various logic gates such as a NAND gate with three or more inputs, a NOR gate, an XOR, and a composite gate of them, and various analog circuits such as a current mirror circuit and a sense amplifier, the layout area thereof can be reduced to realize a circuit having a small area.

Consequently, the chip area of a semiconductor integrated circuit employing a logic gate or an analog gate circuit can be reduced to realize a semiconductor integrated circuit having a small area.

Embodiment 3

Electronic devices employing a transistor according to the invention include a video camera, a digital camera, a goggle type display (head mounted display), a navigation system, a sound reproducing device (a car audio equipment, an audio set, and the like), a computer, a game machine, a portable information equipment (a mobile computer, a mobile phone, a portable game machine, an electronic book, and the like), an image reproducing device including a recording medium (more specifically, a device which can reproduce a recording medium such as a digital versatile disc (DVD), and which includes a display for displaying the reproduced image), or the like. Specific examples of the electronic apparatuses are illustrated in FIGS. 8A to 8E.

Figure 8A:
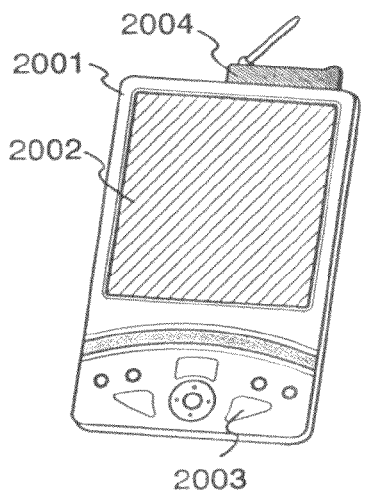
FIGS. 8A to 8E are examples to which a transistor according to the invention is applied.

FIG. 8A illustrates a portable information terminal which includes a main body 2001, a display portion 2002, an operating key 2003, a modem 2004, and the like. Although the modem 2004 is removable in the portable information terminal shown in FIG. 8A, it may be incorporated into the main body 2001. By employing a transistor according to the invention, the area of a semiconductor chip for a portable information terminal can be reduced, and thereby a compact or low-cost portable information terminal can be realized.

Figure 8B:

FIG. 8B illustrates a mobile phone which includes a main body 2101, a display portion 2102, an audio input portion 2103, an audio output portion 2104, an operating key 2105, an external connecting port 2106, an antenna 2107, and the like. By displaying white text on a black background in the display portion 2102, power consumption of the mobile phone can be suppressed. By employing a transistor according to the invention, the area of a semiconductor chip for a mobile phone can be reduced, and thereby a compact or low-cost mobile phone can be realized.

Figure 8C:
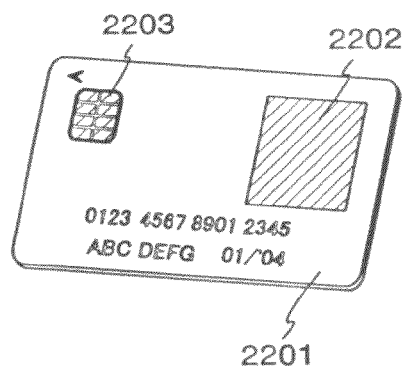

FIG. 8C illustrates an electronic card which includes a main body 2201, a display portion 2202, a connecting terminal 2203, and the like. By employing a transistor according to the invention, the area of a semiconductor chip for an electronic card can be reduced, and thereby a compact or low-cost electronic card can be realized. Note that although the electronic card shown in FIG. 8C is a contact type, the invention can be applied to an electronic card of a non-contact type or a compatible type having both contact and non-contact functions as well.

Figure 8D:
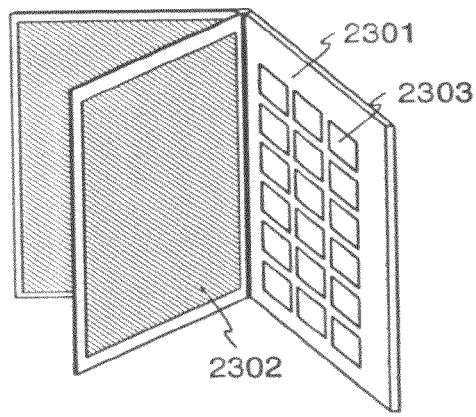

FIG. 8D illustrates an electronic book which includes a main body 2301, a display portion 2302, an operating key 2303, and the like. The main body 2301 may incorporate a modem. By employing a transistor according to the invention, the area of a semiconductor chip for an electronic book can be reduced, and thereby a compact or low-cost electronic book can be realized.

Figure 8E:
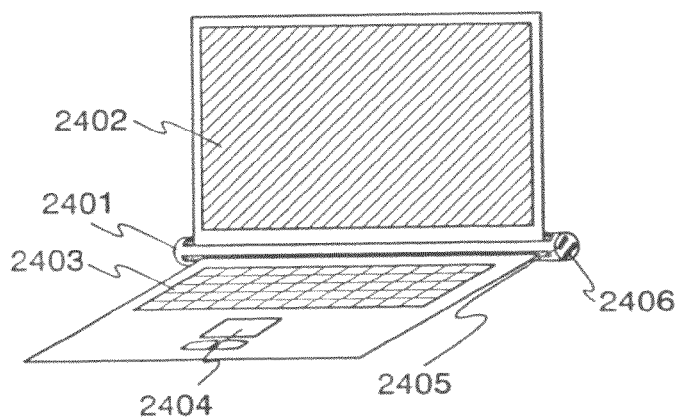

FIG. 8E illustrates a sheet type computer which includes a main body 2401, a display portion 2402, a keyboard 2403, a touch pad 2404, an external connecting port 2405, a power plug 2406, and the like. By employing a transistor according to the invention, the area of a semiconductor chip for a sheet type computer can be reduced, and thereby a compact or low-cost sheet type computer can be realized.

As described above, the application range of the invention is so wide that the invention can be applied to various electronic apparatuses in any field. The electronic apparatuses described in this embodiment can adopt any one of configurations described in Embodiments 1 and 2 in combination.

This application is based on Japanese Patent Application serial no. 2003-373510 filed in Japan Patent Office on Oct. 31, 2003, the contents of which are hereby incorporated by reference.

What is claimed is:

1. An electronic device comprising a transistor, the transistor comprising:
   an active region including a first impurity region and a second impurity region;
   a gate electrode adjacent to the active region, wherein the gate electrode has a length of L;
   a first wiring electrically connected to the first impurity region via a first contact hole and a second contact hole, each having a diameter of R; and
   a second wiring electrically connected to the second impurity region via a third contact hole and a fourth contact hole, each having the diameter of R,
   wherein an area of the active region is substantially $2R \times ((\sqrt{3})R+L)$.

2. An electronic device according to claim 1, wherein each of the first contact hole, and the second contact hole is larger than a gate length of the gate electrode.

3. An electronic device according to claim 1, wherein each distance between the first contact hole and the gate electrode, and between the second contact hole and the gate electrode is larger than a gate length of the gate electrode.

4. An electronic device according to claim 1, wherein the transistor is incorporated in a semiconductor integrated circuit.

5. An electronic device according to claim 1, wherein the electronic device is one selected from the group consisting of a portable information terminal, a mobile phone, an electronic card, an electronic book, and a sheet type computer.

6. An electronic device comprising a transistor, the transistor comprising:
   an active region including a first impurity region and a second impurity region;
   a gate electrode adjacent to the active region, wherein the gate electrode has a length of L;
   a first wiring electrically connected to the first impurity region via a first contact hole and a second contact hole, each having a diameter of R; and
   a second wiring electrically connected to the second impurity region via a third contact hole and a fourth contact hole, each having the diameter of R,
   wherein an area of the active region is substantially $2R \times ((\sqrt{3})R+L)$, and
   wherein the gate electrode snakes between the first contact hole and the second contact hole.

7. An electronic device according to claim 6, wherein each of the first contact hole, and the second contact hole is larger than a gate length of the gate electrode.

8. An electronic device according to claim 6, wherein each distance between the first contact hole and the gate electrode, and between the second contact hole and the gate electrode is larger than a gate length of the gate electrode.

9. An electronic device according to claim 6, wherein the transistor is incorporated in a semiconductor integrated circuit.

10. An electronic device according to claim 6, wherein the electronic device is one selected from the group consisting of a portable information terminal, a mobile phone, an electronic card, an electronic book, and a sheet type computer.

* * * * *